United States Patent
Nakane et al.

[11] Patent Number: 6,038,160
[45] Date of Patent: Mar. 14, 2000

[54] FERROELECTRIC SEMICONDUCTOR MEMORY DEVICE

[75] Inventors: Joji Nakane, Nara; Nobuyuki Moriwaki, Kyoto, both of Japan

[73] Assignee: Matsushita Electronics Corporation, Osaka, Japan

[21] Appl. No.: 08/981,441

[22] PCT Filed: Nov. 4, 1997

[86] PCT No.: PCT/JP97/01267

§ 371 Date: May 28, 1998

§ 102(e) Date: May 28, 1998

[87] PCT Pub. No.: WO97/40500

PCT Pub. Date: Oct. 30, 1997

[30] Foreign Application Priority Data

Apr. 19, 1996 [JP] Japan .................. 8-098269

[51] Int. Cl.[7] .................. G11C 11/22
[52] U.S. Cl. .................. 365/145; 365/149
[58] Field of Search .................. 365/145, 149, 365/189.09, 190, 189.11

[56] References Cited

U.S. PATENT DOCUMENTS

| | | | |
|---|---|---|---|
| 4,873,664 | 10/1989 | Eaton, Jr. | 365/145 |
| 5,329,485 | 7/1994 | Isono et al. | 365/145 |
| 5,341,325 | 8/1994 | Nakano et al. | 365/145 |
| 5,406,510 | 4/1995 | Mihara et al. | 365/145 |
| 5,430,671 | 7/1995 | Hirano et al. | 365/145 |
| 5,432,731 | 7/1995 | Kirsch et al. | 365/145 |
| 5,515,312 | 5/1996 | Nakakuma et al. | 365/145 |
| 5,546,342 | 8/1996 | Nakane et al. | 365/189.01 |
| 5,598,366 | 1/1997 | Kraus et al. | 365/145 |

FOREIGN PATENT DOCUMENTS

| | | |
|---|---|---|
| 0 615 247 | 9/1994 | European Pat. Off. . |
| 0 627 741 | 12/1994 | European Pat. Off. . |
| 0 631 287 | 12/1994 | European Pat. Off. . |
| 0 702 372 | 3/1996 | European Pat. Off. . |
| 63-201998 | 8/1988 | Japan . |
| 7-226086 | 8/1995 | Japan . |
| 7-226087 | 8/1995 | Japan . |
| WO 95/02883 | 1/1995 | WIPO . |

OTHER PUBLICATIONS

Japanese language search report of Int'l Appln No. PCT/JP97/01267 dated Jul. 8, 1997.
English translation of Form PCT/ISA/210.
European Search Report for Int'l Appln No. 97915714 dated Oct. 2, 1998.
European Search Report corresponding to Application No. EP 97 91 5714 dated Jul. 28, 1998.

*Primary Examiner*—Son Mai
*Attorney, Agent, or Firm*—Ratner & Prestia

[57] ABSTRACT

A semiconductor memory device of nonvolatile ferroelectric capable of stable operation without loss of logic voltage "L" data of the memory cell in rewriting operation. To achieve, for example, as shown in FIG. 1, diodes 1, 2 are connected to cell plate lines 39, 40. Therefore, in rewriting operation, if there is a parasitic resistance 3 in the cell plate line 39, it is possible to prevent occurrence of transient phenomenon of temporary transition of the cell plate line 39 to an excessive negative voltage (for example, lower than –1V) which may cause loss of data.

8 Claims, 11 Drawing Sheets

FERROELECTRIC SEMICONDUCTOR MEMORY DEVICE

This application is a U.S. National Phase Application of PCT International Application PCT/JP96/01267.

TECHNICAL FIELD

The present invention relates to a semiconductor memory device using a ferroelectric capacitor.

BACKGROUND ART

In a semiconductor memory device, mainly, an electric charge is accumulated in a memory cell capacitor formed within a semiconductor device, and the data is stored depending on presence or absence of the electric charge (generally called dynamic memory or DRAM). In this memory cell capacitor, hitherto, a silicon oxide film was used as a capacity insulation film. Recently, using a ferroelectric material as a capacity insulation film of a memory cell capacitor, a semiconductor memory device for realizing nonvolatility of stored data is proposed.

A semiconductor memory device using a ferroelectric film as a capacity insulation film of a memory cell capacitor is described below.

Figure 9:
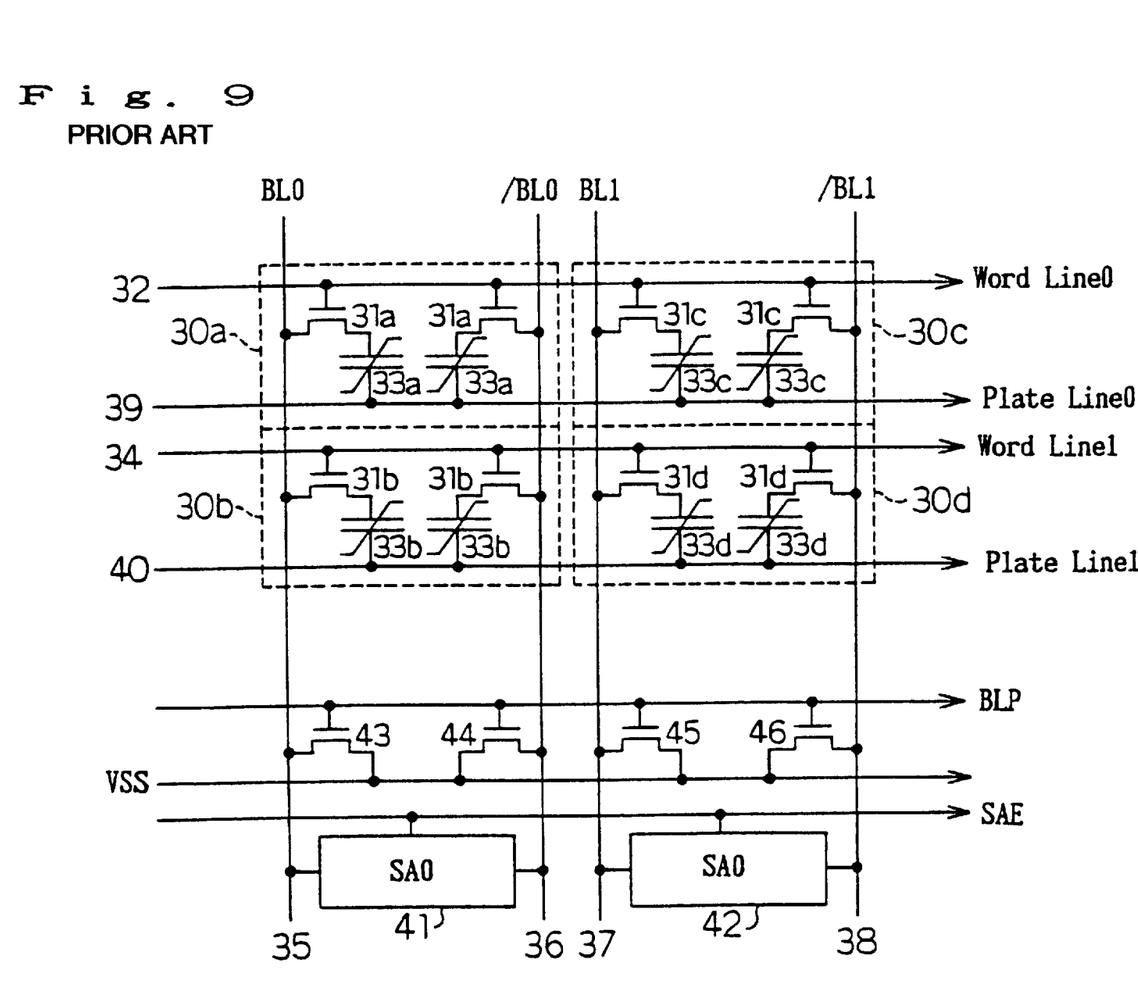
FIG. 9 is a circuit block diagram of a semiconductor memory device in a prior art.

FIG. 9 is a circuit block diagram of a conventional semiconductor memory device.

In FIG. 9, reference numerals 30a to 30d are memory cells, and 31a to 31d are memory cell transistors. Reference numerals 32, 34 are word lines, and 33a to 33d are memory cell capacitors. Reference numerals 35 to 38 are bit lines, and 39, 40 are cell plate lines. Reference numerals 41, 42 are sense amplifiers, 43 to 46 are bit line precharging transistors, BLP is a bit line precharge control signal, and SAE is a sense amplifier control signal.

As shown in FIG. 9, in a circuit configuration of a conventional semiconductor memory device, the bit line 35 (BL0) and bit line 36 (/BL0) are connected to the sense amplifier 41. Two memory cells 30a, 30b are connected to these bit lines 35, 36.

In the memory cell 30a, two memory cell capacitors 33a and two MOS transistors are provided. These two memory cell capacitors 33a have two electrodes individually. One electrode of the two electrodes of one memory cell capacitor 33a (located at the left side in the drawing) is connected to the bit line 35 through the MOS transistor 31a (located at the left side in the drawing), and the other electrode is connected to the cell plate line 39. The other one of the two electrodes of the memory cell capacitor 33a (located at the right side in the drawing) is connected to the bit line 36 through the MOS transistor 31a (located at the right side in the drawing), and the other electrode is connected to the cell plate line 39. Each gate of the two MOS transistors 31a is connected individually to the word line 32 (word line 0).

The memory cells 30b to 30d are composed same as the memory cell 30a.

The bit lines 35, 36 are connected to the grounding potential (VSS) through the MOS transistors 43, 44 controlled by the bit line precharge control signal BLP.

In the conventional semiconductor memory device shown in FIG. 9, one memory cell 30a is composed of two memory cell capacitors 33a and two MOS transistors 31a. When writing data, one of the two memory cell capacitors 33a is written in logic voltage "H", and the other in logic voltage "L", and when reading out the data, the potential difference being read out from the two memory cell capacitors 33a is amplified by the sense amplifier 41 and the data is read out.

Figure 10:
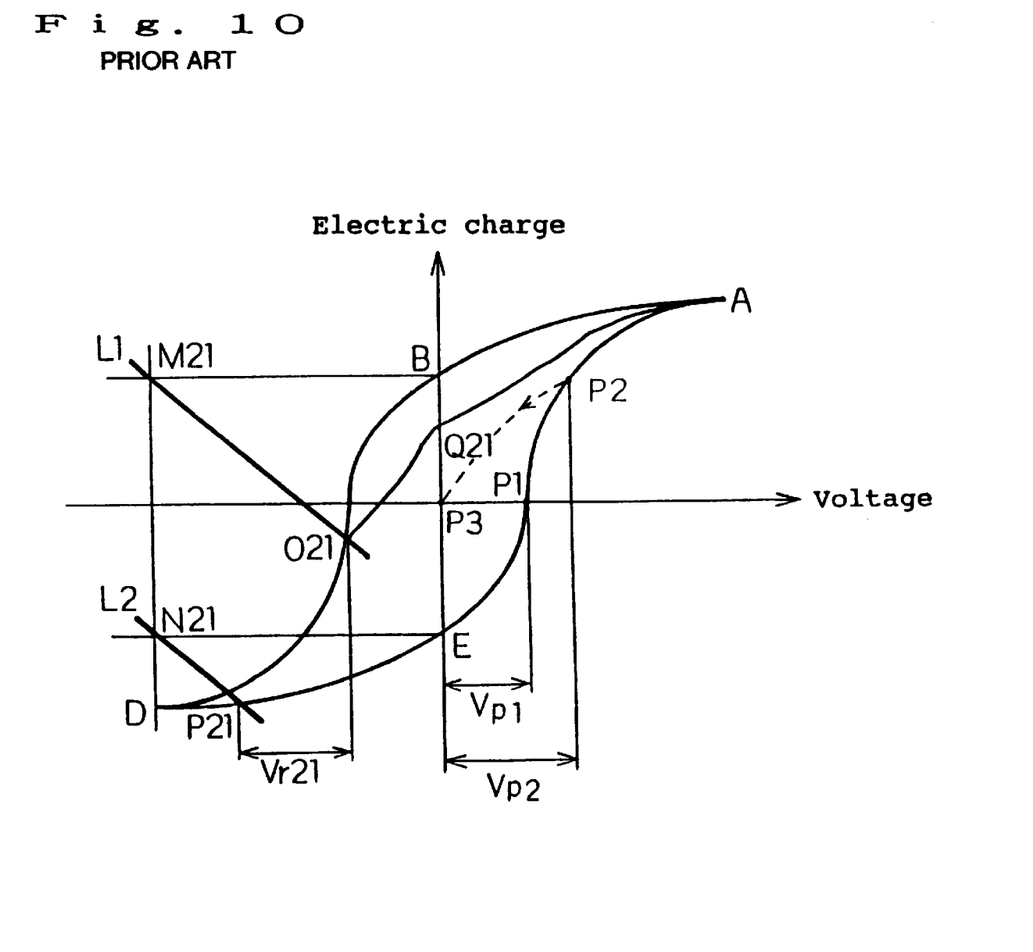
FIG. 10 is a diagram for explaining reading of memory cell data in the conventional semiconductor memory device.

The operation of the ferroelectric memory using a ferroelectric material as a capacity insulating film is described below while referring to FIG. 10 and FIG. 11. FIG. 10 is a diagram for explaining reading of data in the memory cell in the conventional semiconductor memory device, and a hysteresis curve of ferroelectric is shown.

In the capacitor using ferroelectric material as a capacity insulating film, a residual electric field is left over as indicated at point B and point E even if the voltage is 0 as shown in FIG. 10.

Thus, by utilizing the residual electric field left over in the ferroelectric capacitor even after turning off the power source as nonvolatile data, a nonvolatile semiconductor memory device is realized.

That is, when the data of the memory cell 30a is "1," one memory cell capacitor 33a (called first memory cell capacitor) out of two memory cell capacitors 33a is in the state of point B, and the other memory cell capacitor 33a (called second memory cell capacitor) is in the state of point E.

When the data of the memory cell 30a is "0," contrary to the case above, the first memory cell capacitor is in the state of point E, and the second memory cell capacitor, in the state of point B.

Figure 11:
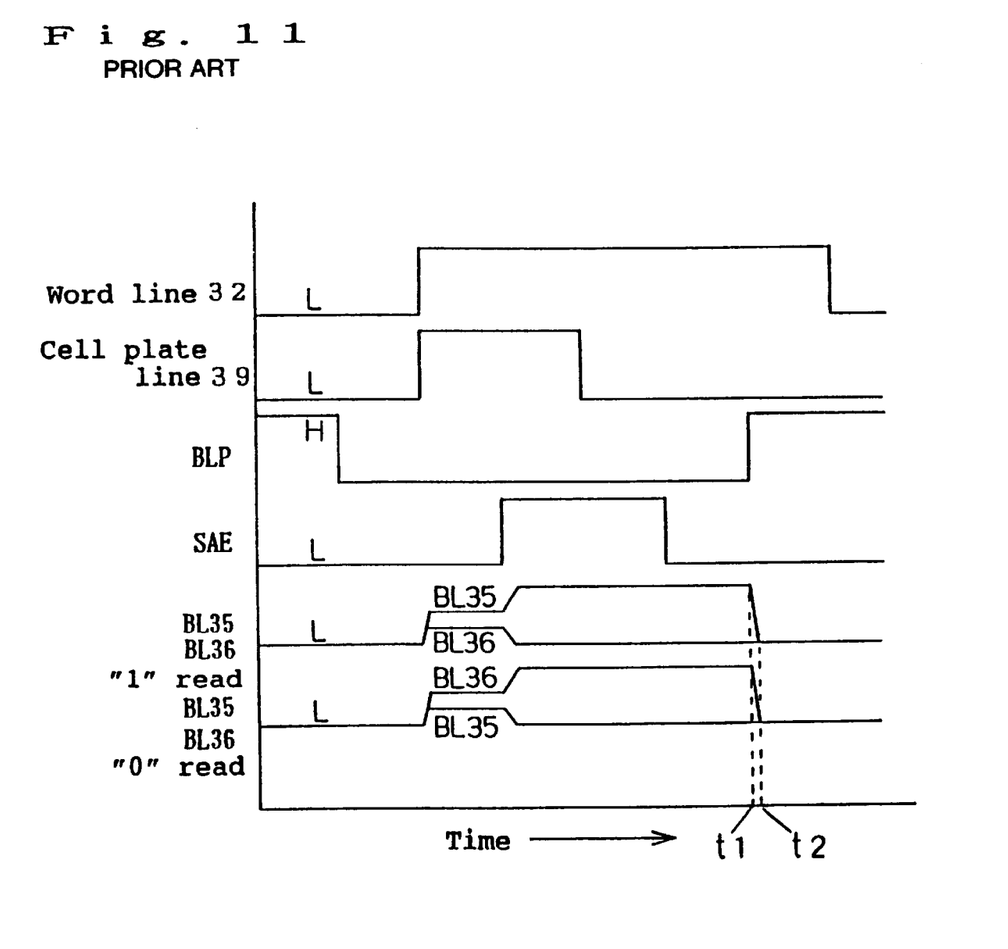
FIG. 11 is a diagram showing an operation timing of the conventional semiconductor memory device.

FIG. 11 is an operation timing diagram of a conventional semiconductor memory device.

In the initial state, the bit lines 35, 36, word lines 32, 34, cell plate line 39, and sense amplifier control signal SAE are all at logic voltage "L," and the bit line precharge control signal BLP is at logic voltage "H." In this state, first, the bit line precharge control signal BLP is at logic voltage "L," and the bit lines 35, 36 are in floating state. Next, the word line 32 and cell plate line 39 are set at logic voltage "H," and the two MOS transistors 31a are turned on. At this time, an electric field is applied in each of the two memory cell capacitors 33a, and data is being read out in the bit lines 35, 36 from the memory cell 30a.

The voltage difference being read out in the bit lines 35, 36 at this time is described while referring to FIG. 10.

In FIG. 10, reference numerals L1, L2 are lines having an inclination determined by the parasitic capacity value of the bit lines 35, 36.

That is, when the data being read out is "1," data is read out in the bit line 35 from one memory cell capacitor 33a (the first memory cell capacitor), thereby changing from the state of point B to the state of point O21.

The point O21 is the intersection of a hysteresis curve moving from point B toward point D when a voltage is applied to the memory cell capacitor 33a, and a line L1 passing through a point M21 moving on the axis of abscissas from point B by the portion of the voltage caused when the logic voltage of the word line 32 and cell plate line 39 is "H."

Similarly, in the bit line 36, data is read out from the other memory cell capacitor 33a (the second memory cell capacitor), changing from the state of point E to the state of point P21. The point P21 is the intersection of a hysteresis curve moving from point E toward point D when a voltage is applied to the memory cell capacitor 33a, and a line L2 passing through a point N21 moving on the axis of abscissas from point E by the portion of the voltage caused when the logic voltage of the word line 32 and cell plate line 39 is "H". Herein, the voltage difference being read out at the bit line 35 and bit line 36 is a difference Vr21 of the voltages at point O21 and point P21. It is the same when the data being read out is "0", and only the state of the bit line 35 and bit line 36 is inverted, and the potential difference being read out is Vr21. Incidentally, the reversed state of bit line 35 and bit line 36 is also shown in FIG. 11.

Next, setting the sense amplifier control signal SAE to logic voltage "H", the data being read out in the bit line 35 and bit line 36 is amplified by the sense amplifier 41, and the data is read out. When amplified by this sense amplifier 41, the state of the bit line 35 is changed from point O21 to point Q21, and the state of the bit line 36 is changed from point P21 to point D.

Then, as the data rewriting state, the cell plate line 39 is set at logic voltage "L". At this time, in FIG. 10, the state of the bit line 35 is changed from point Q21 to point A, and the state of the bit line 36, from point D to point E. Consequently, the sense amplifier control signal SAE is set to logic voltage "L."

Afterwards, setting the bit line precharge control signal BLP to logic voltage "H", setting the bit lines 35, 36 to logic voltage "L", and finally setting the word line to logic voltage "L", there is no voltage difference between both terminals of the ferroelectric capacitor of the memory cell, and the state of point B and point E in FIG. 10 is established, thereby returning to the initial state. As a result, rewriting operation is over.

However, in the semiconductor memory device of such conventional constitution and operation, in spite of rewriting operation, the residual charge of the ferroelectric disappears and the "L" data of the memory cell may be lost. The cause of such data loss was not disclosed yet.

DISCLOSURE OF THE INVENTION

In the light of the above problems of the conventional semiconductor memory device, it is an object of the invention to present a semiconductor memory device capable of operating more stably than before in rewriting operating.

To achieve the object, the semiconductor memory device of the invention comprises a ferroelectric capacitor composed of a ferroelectric, plural memory cells, having single or plural ferroelectric capacitors provided in each, for storing information by making use of polarized state of the ferroelectric, word lines connected to the memory cells, for use in selection of the memory cells, data lines connected to the memory cells, for use in reading of the information from the selected memory cell, cell plate lines connected to the memory cells, for use in reading and rewriting of the information, and voltage stabilizing means for stabilizing the voltage applied to the cell plate line when rewriting the ferroelectric capacitor.

Accordingly, for example, when rewriting, the cell plate lines are suppressed from temporarily becoming an excessive negative voltage. Therefore, of the complementary data, the residual charge of the ferroelectric capacitor corresponding to the logic voltage "L" does not decrease or disappear, so that a semiconductor memory device of nonvolatile ferroelectric operating more stably will be realized.

REFERENCE NUMERALS 1, 2 Diode
3, 4 Parasitic resistance
5, 6 Cell plate line driver
7, 8 N-type transistor
9, 10 Ferroelectric capacitor
11a–11d Resistance element
12a–12d Capacity element

BEST MODE FOR CARRYING OUT THE INVENTION

Referring now to the drawings, embodiments of the invention are described specifically below.

Herein, prior to the explanation of the embodiments of the invention, the cause of occurrence of the above phenomenon of loss of data of "L" in the memory cell due to disappearance of residual charge in the ferroelectric, which is shown by the present invention, is described first while referring to FIG. 9 through FIG. 11.

That is, in the above conventional semiconductor memory device, actually, a parasitic resistance (Rcp) is present between the cell plate line 39 and the driver for driving the cell plate line 39. Such parasitic resistance (Rcp) is formed by wiring resistance, contact resistance, and the like.

In the above rewriting operation by setting the bit line precharge control signal BLP at logic voltage "H" and the bit lines 35, 36 at logic voltage "L," for example, when the word line 32 is at "H" and the bit line 36 maintains the "L" state and the bit line 35 changes from "H" state to "L" state, the cell plate line 39 receives an effect due to coupling of capacitor capacity (Cmc) of the ferroelectric capacitor 33a in the memory cell 30a. At this time, further, if a parasitic resistance (Rcp) is present in the cell plate line 39, the cell plate line 39 temporarily becomes a negative voltage. At this time, the time constant is about n×Rcp×Cmc. Herein, n is the number of bit line pairs that are activated simultaneously.

It is a feature of the ferroelectric memory cell that the capacity per unit area is large, but in the case of rewriting operation, the coupling capacity of the bit line and cell plate line becomes large.

Supposing the memory cell capacity to be constant, the greater the number of bit line pairs (n) activated simultaneously and the greater the parasitic resistance, the larger negative voltage has the cell plate line.

For example, if eight bit line pairs are activated, the parasitic resistance (Rcp) of plate line is 500 ohms, and the capacitor capacity (Cmc) of memory cell is 2 pF, the period of the cell plate line 39 temporarily becoming a negative voltage is 8×500 ohms×2 pF=8 nsec. When the period required for precharging the bit line to the state of logic voltage "L" is shorter than this period, that is, the period of changeover of the bit line from logic voltage "H" state to logic voltage "L" state (the transition time from t1 to t2 in FIG. 11) is shorter than 8 nsec, the cell plate line 39 is temporarily negative in voltage. As a result of simulation, it is found, when the supply voltage is 5 V, the cell plate line 39 is lowered to about −1.5 V.

When the cell plate line 39 is negative in voltage, the operation point of the ferroelectric capacitor (the first memory cell capacitor) for rewriting the logic voltage "L" is moved from point E toward point A in FIG. 10. When the voltage of the cell plate line 39 becomes a negative voltage (Vp2 in the drawing) below voltage Vp1 (coercive voltage: usually about 1 V) determined by the intersection P1 with the axis of the electric field shown in FIG. 10, the operation point E is moved to point P2. Afterwards, the voltage of the cell plate 39 returns to 0 V, and the operation point P2 is moved to point P3. Accordingly, the residual charge of the ferroelectric capacitor corresponding to the logic voltage "L" is decreased or eliminated, so that the data of "0" of the memory cell is lost substantially. Incidentally, when the absolute value of the negative voltage Vp2 is further larger, the polarity of the residual charge of the ferroelectric capacitor is inverted, so that the data of "0" of the memory cell is lost, too.

It is known that the operation of the nonvolatile memory is unstable due to such cause.

As mentioned above, embodiments of the semiconductor memory device of the invention is described below while referring to the drawings. Those same as shown in FIG. 9 through FIG. 11 are identified with same reference numerals.

(First embodiment)

Figure 1:
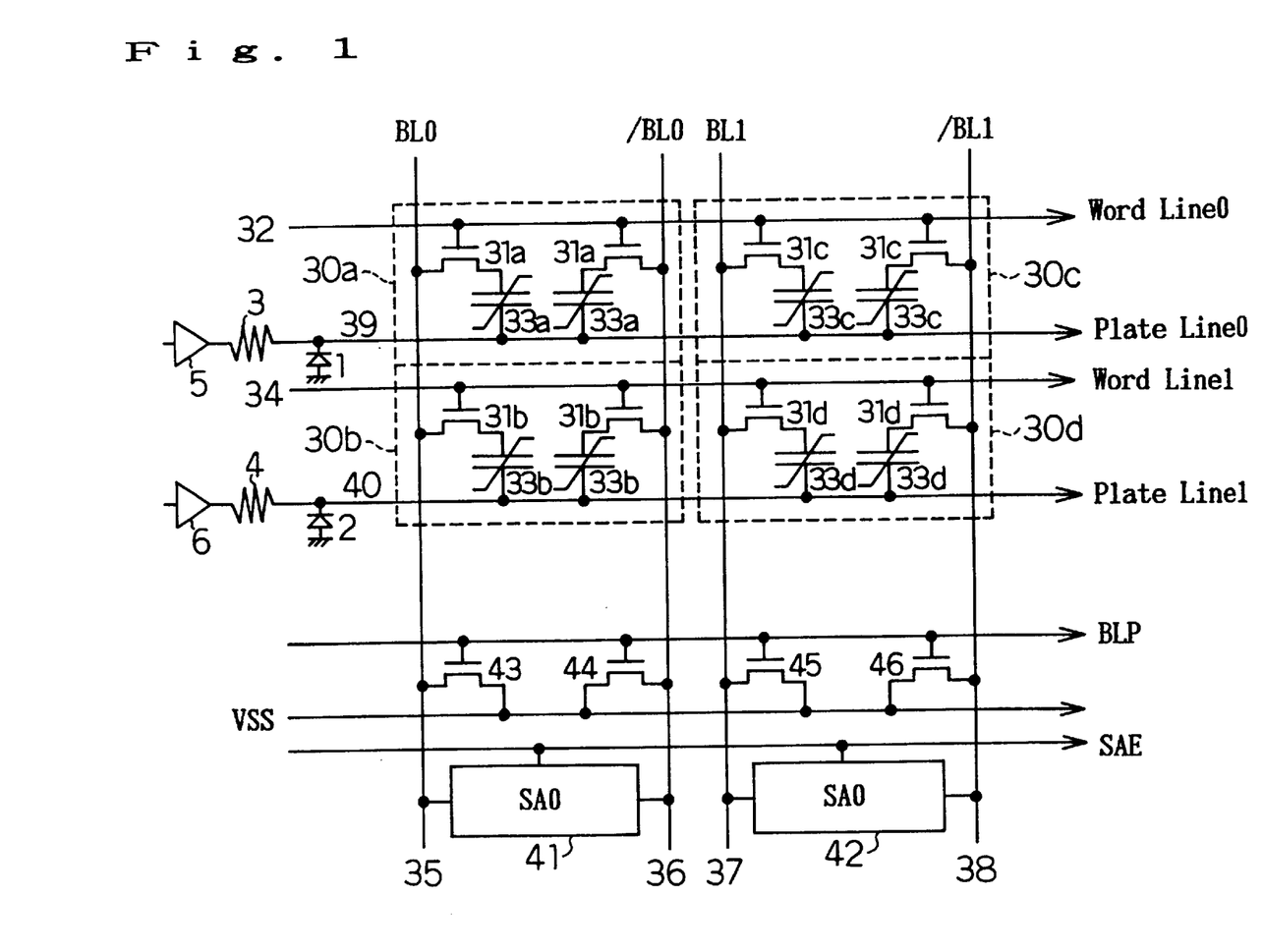
FIG. 1 is a circuit block diagram of a semiconductor memory device in a first embodiment of the invention.

FIG. 1 is a circuit block diagram of a first embodiment of a semiconductor memory device of the invention.

In FIG. 1, reference numerals 1, 2 are diodes, and 3, 4 are parasitic resistances. Reference numerals 5, 6 are drivers of cell plate lines 39, 40. The N type semiconductor region (negative electrode side) of the diodes 1, 2 is connected to the cell plate lines 39, 40, and the P type semiconductor region (positive electrode side) to the grounding potential. Herein, the data lines of the invention correspond to bit lines 35 to 38, respectively. The voltage stabilizing means of the invention corresponds to the diodes 1, 2.

Figure 2:
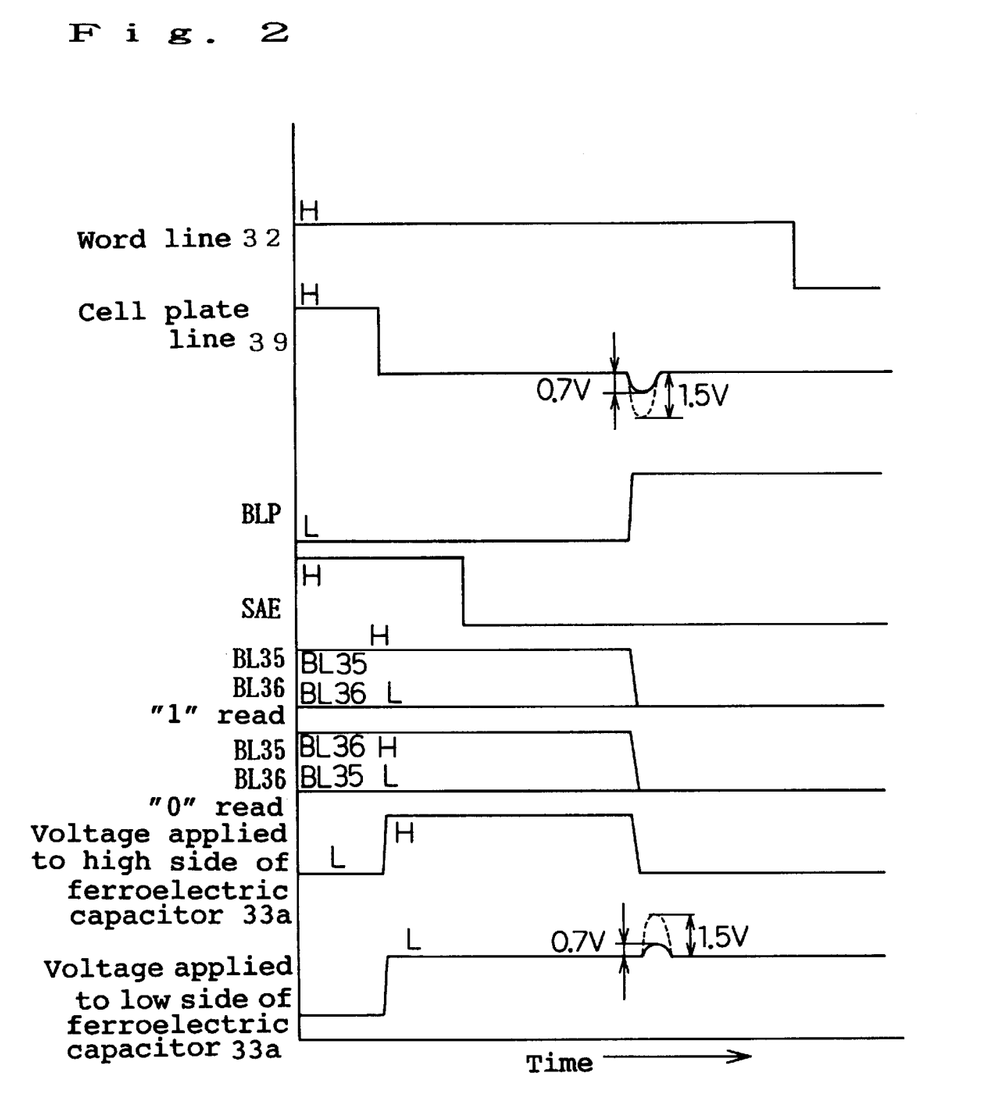
FIG. 2 is a rewriting operation timing diagram of an actual semiconductor memory device.

FIG. 2 is a timing chart of rewriting operation of the semiconductor memory device of the embodiment.

In FIG. 1 and FIG. 2, supposing the cell plate line 39 to be at logic voltage "L," the bit line precharge control signal BLP to be at logic voltage "H," and the bit lines 35, 36 to be at logic voltage "L," the operation of the memory cell 30a in rewriting operation into the memory cell is considered.

Actually, between the cell plate driver 5 and cell plate line 39, there is a parasitic resistance 3 due to wiring resistance or contact resistance. When the parasitic resistance 3 is present, as the bit line voltage changes from "H" to "L," the cell plate line 39 temporarily comes negative in voltage due to capacity coupling by the ferroelectric capacitor capacity (Cmc). By simulation, it is known that the negative voltage is about 1.5 V. As indicated by broken line in FIG. 2, the voltage applied to the ferroelectric capacitor is a positive voltage of about 1.5 V when the data of the memory cell is at the low side.

However, by inserting the diode 1, the voltage of the cell plate line 39 is not lowered more than the built-in voltage of the diode (about −0.7 V). That is, in the case of rewriting operation, the cell plate line 39 is not lower than −1 V (for example, −1.5 V), that is, not more than the coercive voltage of the ferroelectric capacitor. Therefore, of the complementary data, the residual charge of the ferroelectric capacitor corresponding to logic voltage "L" is not lost, and a semiconductor memory device of stabler nonvolatile ferroelectric may be realized.

The diodes 1, 2 can be formed simultaneously when forming the source and drain of the N-type transistor of the semiconductor device, and can be reduced in area. Hence, it does not add to the manufacturing cost of the semiconductor memory device.

In the first embodiment, meanwhile, the diodes 1, 2 are located near the cell plate line drivers 5, 6 and parasitic resistances 3, 4, but when located at remotest position from the cell plate line drivers 5, 6 and parasitic resistances 3, 4, effects due to wiring resistance of the cell plate lines 39, 40 themselves can be also decreased.

This embodiment relates to a memory cell of 2T2C type consisting of two transistors and two ferroelectric capacitors, but the same effects are also obtained in the memory cell of 1T1C type consisting of one transistor and one ferroelectric capacitor.

That is, usually, in the case of 1T1C type memory cell, a great feature is that the memory cell size can be reduced, and it is used in the memory device of a large capacity. However, since the memory cells activated simultaneously increase, during use, for example, if seven memory cells are logically in "H" state and one memory cell is logically in "L" state, transition of cell plane line to negative voltage increases, and loss of "L" data occurs more securely.

That is, as compared with the 2T2C type memory cell in which ferroelectric capacitors logically in "H" state and ferroelectric capacitors logically in "L" state are present by the same number, loss of "L" data in the 1T1C type memory cell is more likely to occur, and the operation as the nonvolatile ferroelectric memory tends to be unstable. Therefore, as compared with the semiconductor memory device using 1T1C type memory cell, the effects are greater in the constitution of the embodiment.

(Second embodiment)

Figure 3:
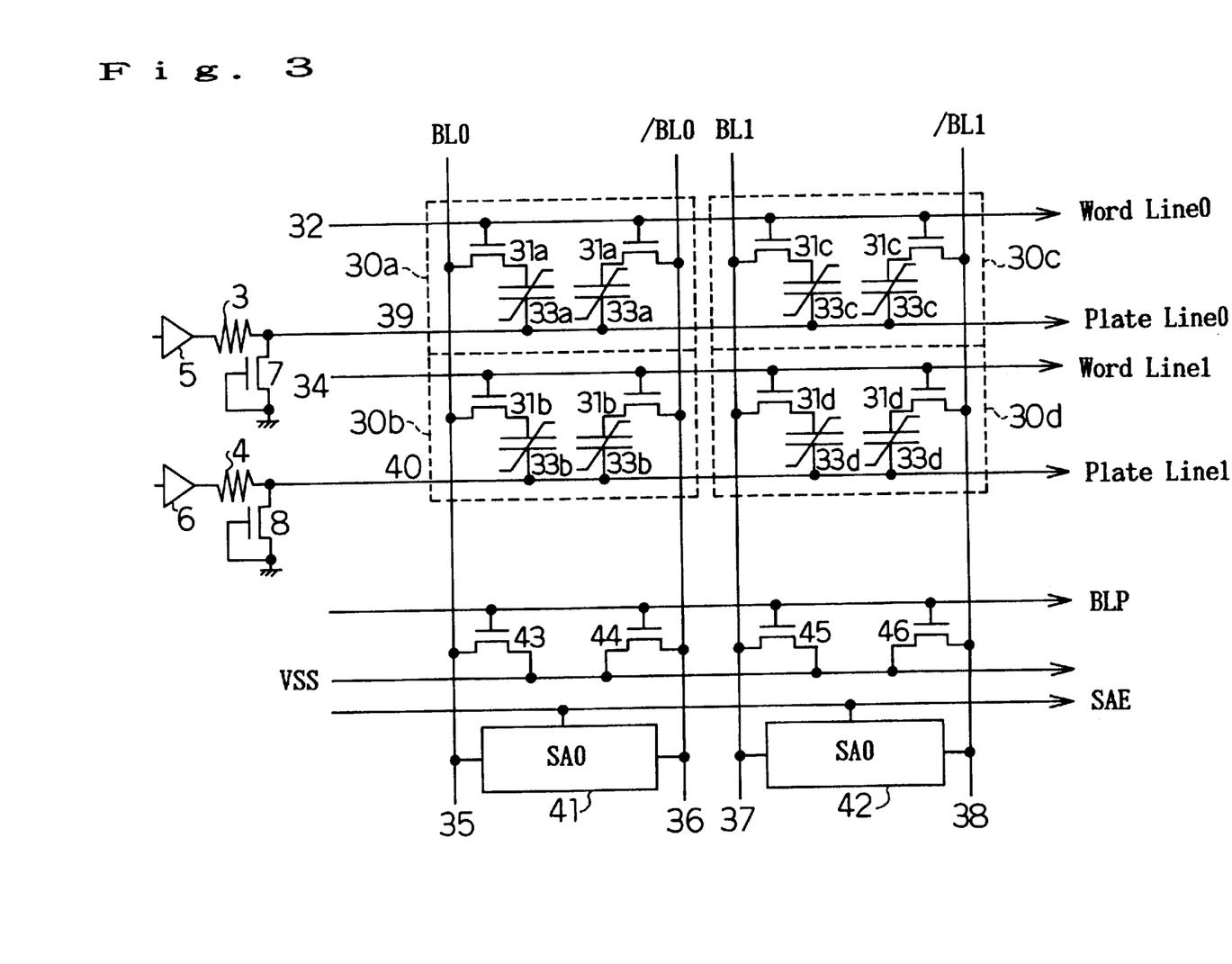
FIG. 3 is a circuit block diagram of a semiconductor memory device in a second embodiment of the invention.

A second embodiment of the invention is described while referring to FIG. 3.

In FIG. 3, reference numerals 7, 8 are N-type transistors. The gate and source of the N-type transistors 7, 8 are connected to the grounding level, and the drain, to the cell plate line 39. The voltage stabilizing means of the invention corresponds to the N-type transistors 7, 8.

When reading out the memory cell 30a, a parasitic resistance 3 is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to the ferroelectric capacitor capacity (Cmc) for setting one of the complementary data to logic voltage "H."

However, owing to the N-type transistor 7, the voltage of the cell plate line 39 is lowered only to the threshold voltage (about −0.7 V) of the N-type transistor 7. That is, in rewriting operation, the cell plate line 39 is prevented from becoming less than −1 V voltage, and the logic voltage "L" data of the memory cell of the complementary data is not lost, so that a semiconductor memory device of stable nonvolatile ferroelectric is obtained.

In the second embodiment, as compared with the first embodiment, the area is increased by the portion of the transistors 7, 8 formed inside the semiconductor memory device. However, in the second embodiment, since the threshold voltage of the transistors 7, 8 is controlled precisely, a stable operation is obtained. By contrast, in the first embodiment, in the inspection process after CMOS process, characteristics of diodes 1, 2 are not monitored, and hence the built-in potential of the diodes 1, 2 may fluctuate.

(Third embodiment)

A third embodiment of the invention is described below while referring to FIG. 4.

Figure 4:
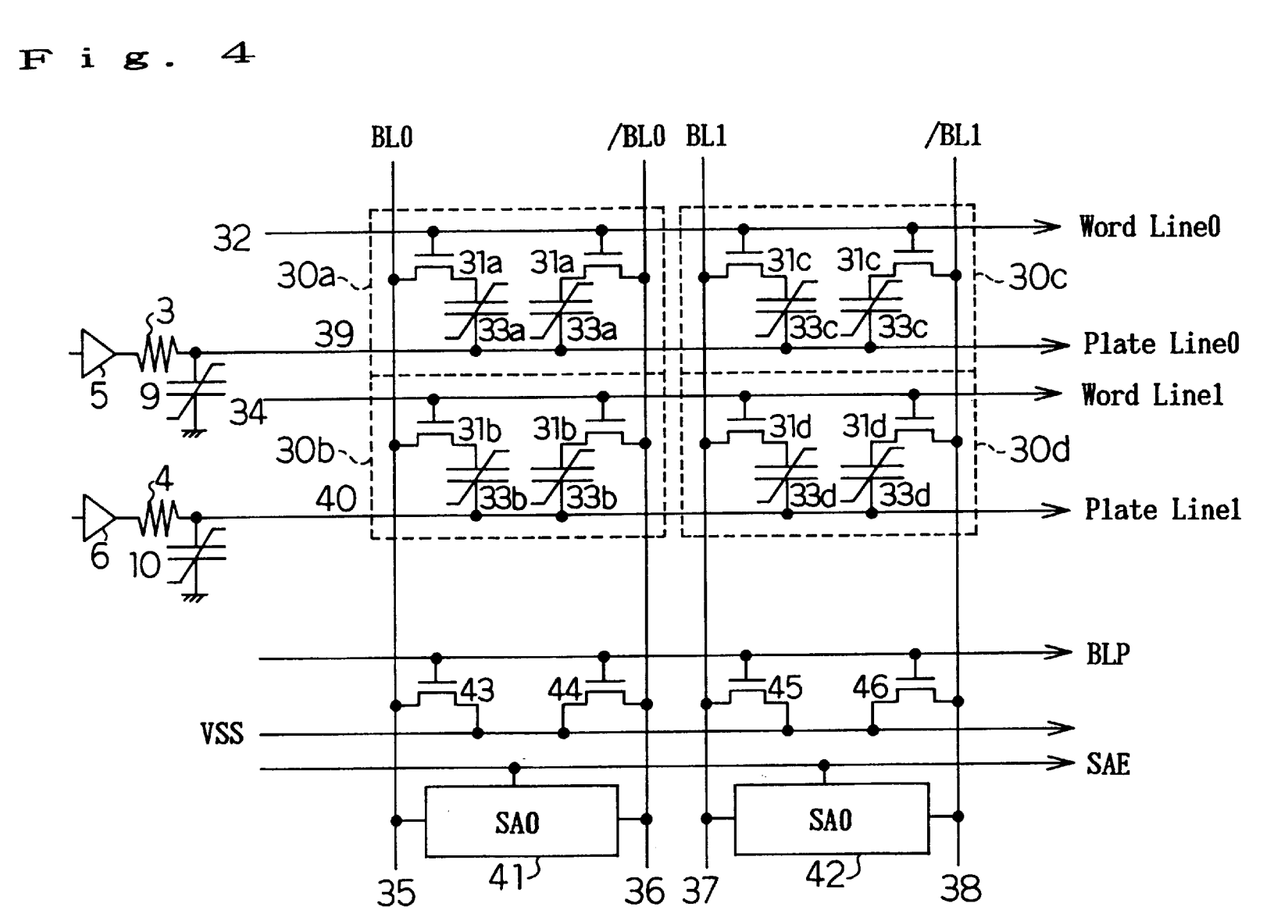
FIG. 4 is a circuit block diagram of a semiconductor memory device in a third embodiment of the invention.

As shown in FIG. 4, ferroelectric capacitors 9, 10 are connected to the grounding level at one electrode, and to the cell plate line at the other electrode. The voltage stabilizing means of the invention corresponds to the ferroelectric capacitors 9, 10.

Considering the case of reading out the memory cell 30a, in the actual semiconductor memory device, a parasitic resistance 3 is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to capacity coupling of the ferroelectric capacitor capacity (Cmc) for setting one of the complementary data to logic voltage "H."

However, by adding the capacity of the ferroelectric capacitors 9, 10, the capacity division ratio of logic voltage "H" capacity of the memory cell and capacity of ferroelectric capacitor 9 varies. Since the voltage of the cell plate line 39 is determined by the capacity division of the memory cell capacity and added capacity 9, when the added ferroelectric capacitor capacity is about the capacity value of the number of memory cells to be activated, the negative voltage value of the cell plate line 39 of temporary transition may be reduced to half (that is, from −1.5 V to −0.7 V).

That is, by increasing the added ferroelectric capacitor capacity, the voltage of the cell plate line 39 can be controlled in rewriting operation, and the logic voltage "L" data of the memory cell of the complementary data is not lost, so that the semiconductor memory device of stable nonvolatile ferroelectric may be realized.

(Fourth embodiment)

A fourth embodiment of the invention is described below while referring to FIG. 5.

Figure 5:
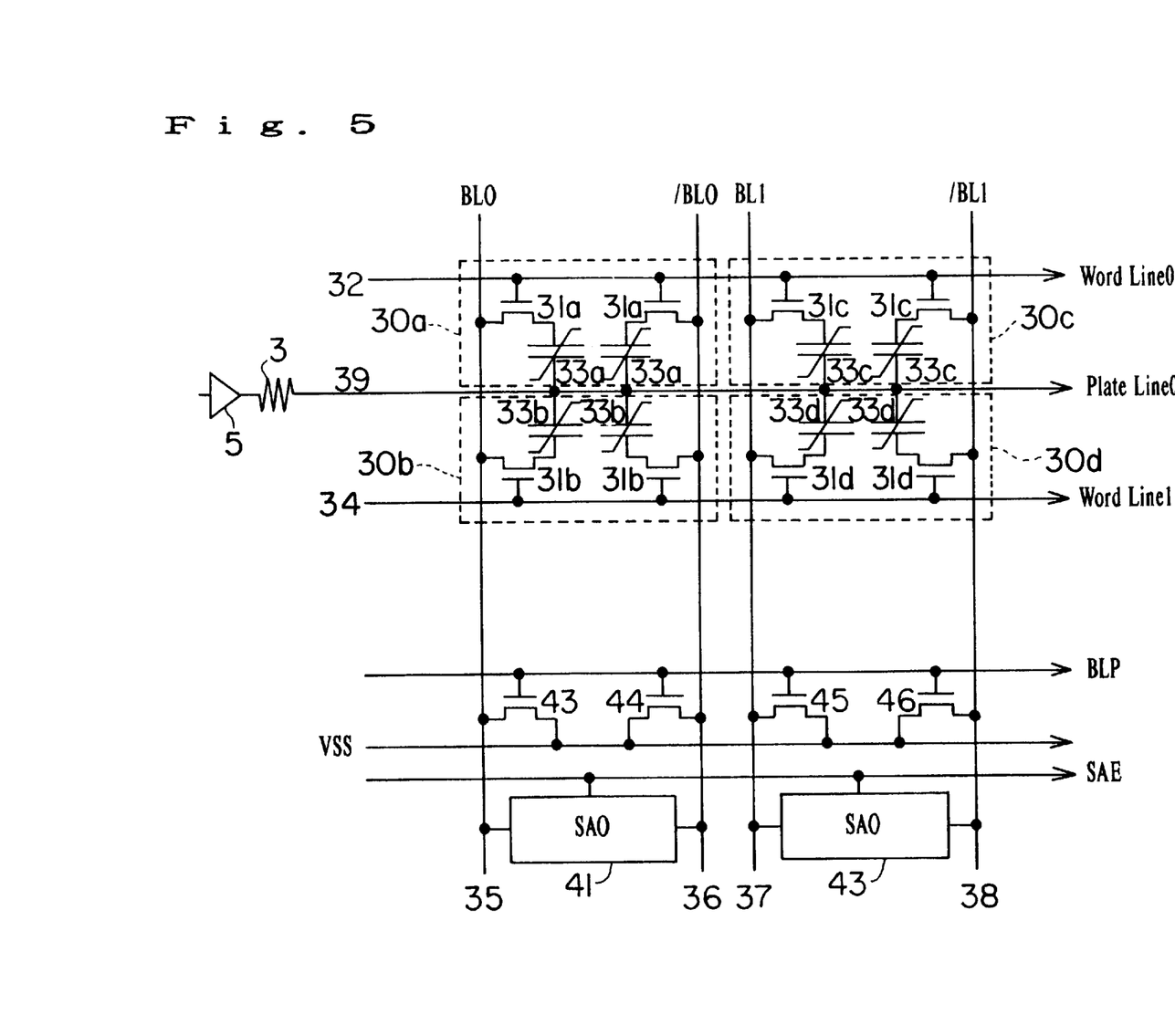
FIG. 5 is a circuit block diagram of a semiconductor memory device in a fourth embodiment of the invention.

As shown in FIG. 5, it is a feature of this embodiment that the cell plate line 39 is shared between the memory cells 30a, 30c, and the memory cells 30b, 30d.

Considering the case of reading out the memory cell 30a, in the actual semiconductor memory, a parasitic resistance 3 is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to capacity coupling of the ferroelectric capacitor capacity (Cmc) for setting one of the complementary data to logic voltage "H."However, by sharing the cell plate line 39 between the memory cells 30a, 30c, and the memory cells 30b, 30d, the parasitic capacity connected to the cell plate line 39 is increased. In this case of rewriting operation, since the voltage of the cell plate line 39 is determined by the capacity division of the parasitic capacity and the logic voltage "H" capacity of the memory cell, the negative voltage value of the cell plate line 39 of temporary transition may be reduced to half.

That is, by sharing the cell plate line 39 between the memory cells 30a, 30c, and the memory cells 30b, 30d, the cell plate line 39 is prevented from becoming lower than −1 V voltage in rewriting operation, and the logic voltage "L" data of the memory cell of the complementary data is not lost, so that the semiconductor memory device of stable nonvolatile ferroelectric may be realized.

(Fifth embodiment)

A fifth embodiment of the invention is described below while referring to FIG. 6.

Figure 6:
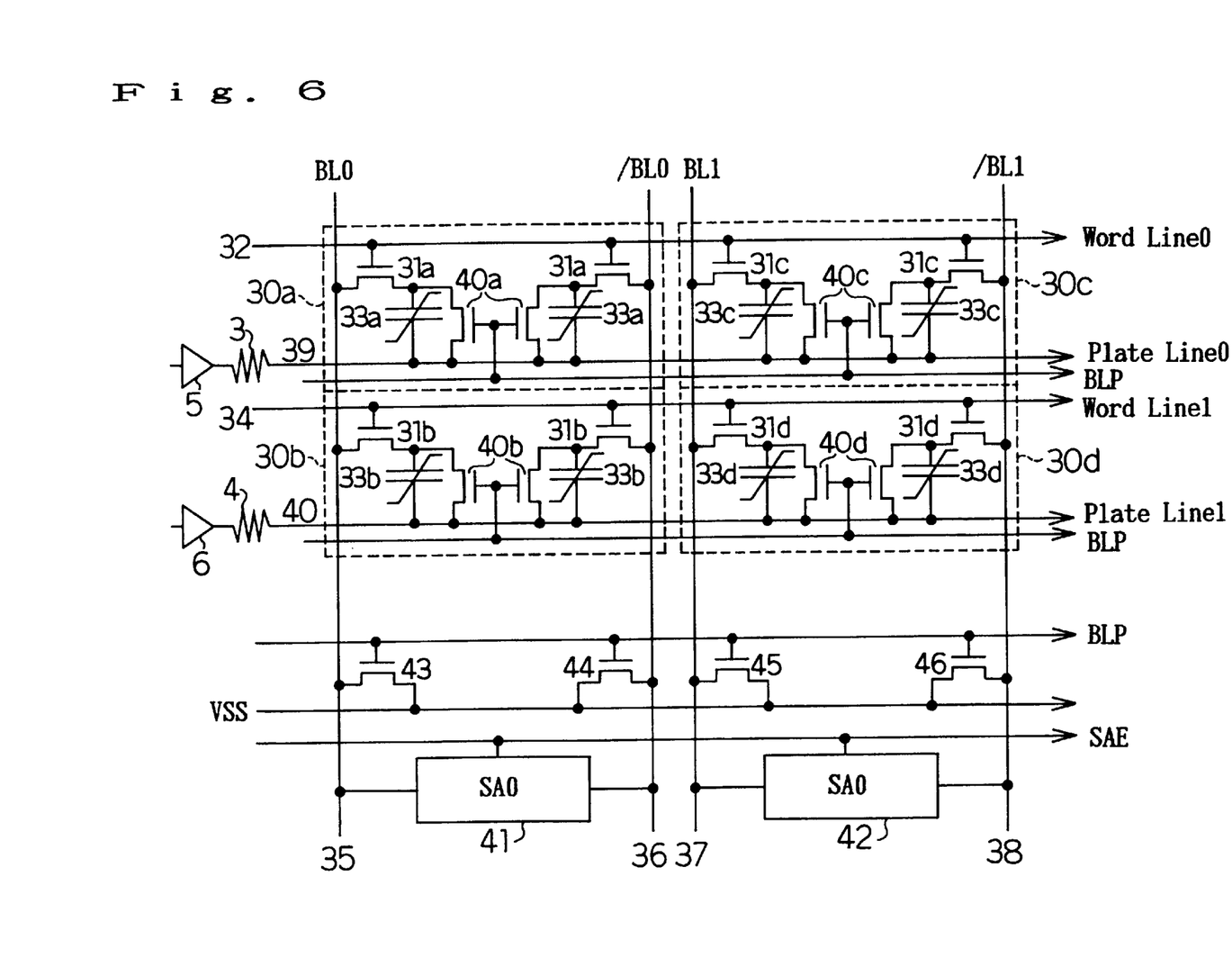
FIG. 6 is a circuit block diagram of a semiconductor memory device in a fifth embodiment of the invention.

In FIG. 6, reference numerals 30a to 30d are memory cells, and 31a to 31d are memory cell transistors. Reference numerals 32, 34 are word lines, and 33a to 33d are memory cell capacitors. Reference numerals 35 to 38 are bit lines, and 39, 40 are cell plate lines. Reference numerals 41, 42 are sense amplifiers, 43 to 46 are bit line precharging transistors, BLP is a bit line precharge control signal, and SAE is a sense amplifier control signal. Reference numerals 40a to 40d are transistors. For example, the drain of the transistor 40a is connected to the junction point of the memory cell transistor 31a and ferroelectric capacitor 33a. The gate of the transistor 40a is connected to the signal line in which the bit line precharge control signal is applied, and its source is connected to the cell plate line 39. The other transistors 40b to 40d are basically connected same as shown in the drawing.

Considering the case of reading out the memory cell 30a, in the actual semiconductor memory, a parasitic resistance 3 is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to capacity coupling of the ferroelectric capacitor capacity (Cmc) for setting one of the complementary data to logic voltage "H."

However, owing to the presence of the transistor 40a, in the process of setting the bit line precharge control signal BLP to logic voltage "H" and the bit lines 35, 36 to logic voltage "L," the cell plate line 39 does not become a negative voltage. Therefore, the voltage applied to both ends of the ferroelectric capacitor of the memory cell will not be inverted.

That is, in rewriting operation, the cell plate line 39 is prevented from becoming lower than 0 V voltage, and the logic voltage "L" data of the memory cell of the complementary data is not lost, so that the semiconductor memory device of stable nonvolatile ferroelectric may be realized.

(Sixth embodiment)

A sixth embodiment of the invention is described below while referring to FIG. 7.

Figure 7:
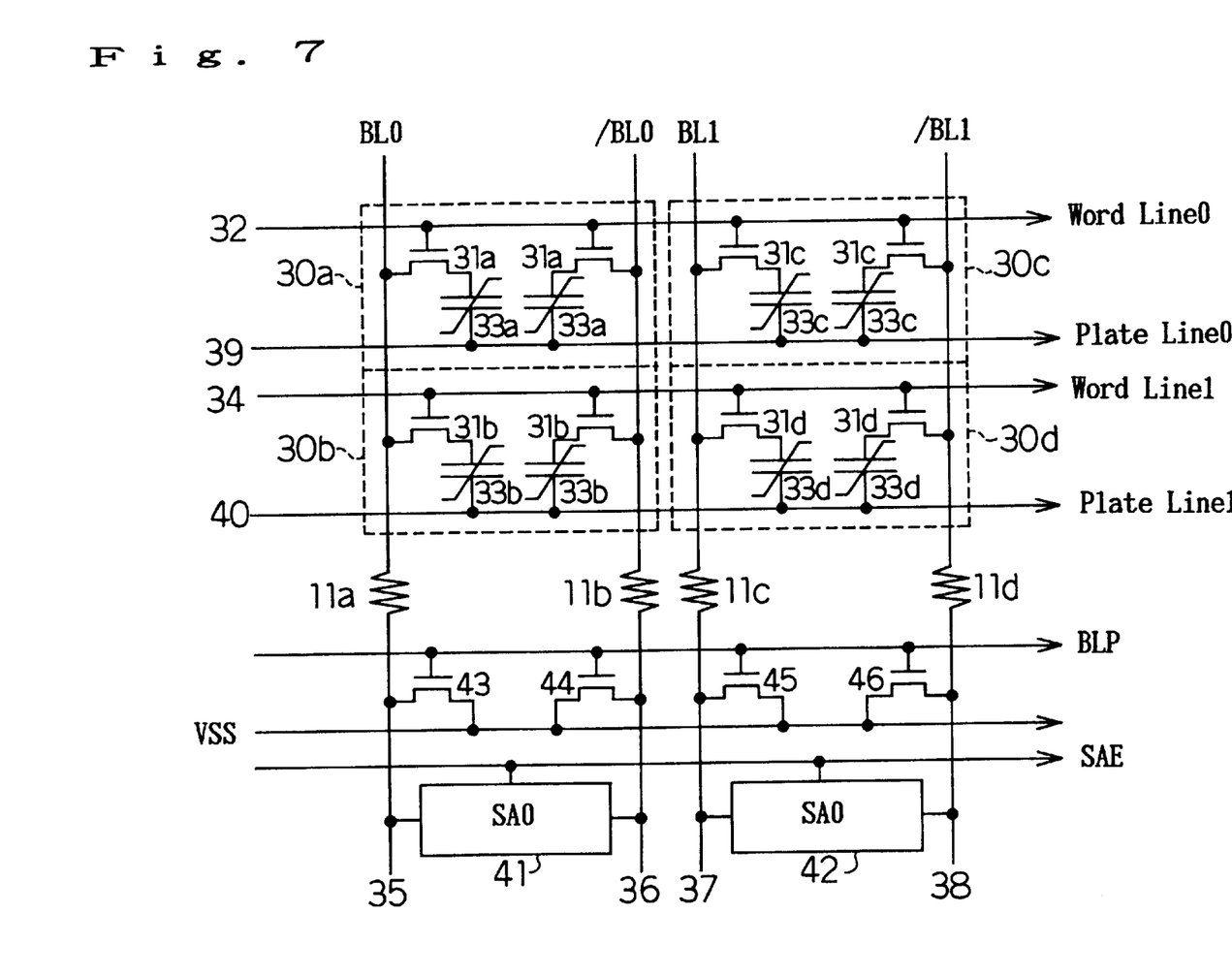
FIG. 7 is a circuit block diagram of a semiconductor memory device in a sixth embodiment of the invention.

In FIG. 7, reference numerals 11a to 11d are resistance elements connected between memory cells 30a to 30d and bit line precharging transistors 43 to 46.

Considering the case of reading out the memory cell 30a, in the actual semiconductor memory, a parasitic resistance 3 (Rcp) is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to capacity coupling of the ferroelectric capacitor capacity (Cmc) for setting one of the complementary data to logic voltage "H."

The time constant is about $n \times Rcp \times Cmc$. Herein, n is the number of bit line pairs activated simultaneously.

It is a feature of the ferroelectric memory cell that the capacity per unit area is large, but in the case of rewriting operation, the coupling capacity of the bit line and cell plate line becomes large.

Supposing the memory cell capacity to be constant, the greater the number of bit line pairs (n) activated simultaneously and the greater the parasitic resistance, the larger negative voltage has the cell plate line.

For example, if eight bit line pairs are activated, the parasitic resistance (Rcp) of plate line is 500 ohms, and the capacitor capacity (Cmc) of memory cell is 2 pF, the period of the cell plate line 39 temporarily becoming a negative voltage is 8×500 ohms×2 pF=8 nsec. When the period required for precharging the bit line is shorter than this period, that is, the period of changeover of the bit line from logic voltage "H" state to logic voltage "L" state (the transition time) is shorter than 8 nsec, the cell plate line 39 is temporarily negative in voltage. As a result of simulation, it is found, when the supply voltage is 5 V, the voltage of the cell plate line 39 is lowered to about −1.5 V.

Herein, setting the transition time (time constant) of the bit line voltage from logic voltage "H" to "L" at 8 nsec or more, the cell plate line does not become negative in voltage, and the operation point of the ferroelectric capacitor for rewriting the logic voltage "L" of the memory cell remains at point E in FIG. 10.

That is, when the capacity of the bit line is 1 pF, setting the resistance value of the resistance elements 11a to 11d existing between the memory cells 30a to 30d and bit line precharging transistors 43 to 46 at 8 kohms or more, the voltage of the cell plate line 39 occurring for precharging the bit line does not become less than 0 V.

More specifically, in rewriting operation, the cell plate line 39 is prevented from becoming lower than 0 V in voltage, and the logic voltage "L" data of the memory cell of the complementary data is not lost, so that the semiconductor memory device of stable nonvolatile ferroelectric may be realized.

Incidentally, these added resistance elements 11a to 11d may be formed of diffusion resistances, but for the sake of precise control in forming process of the semiconductor memory device, it is preferred to form of polysilicon.

(Seventh embodiment)

A seventh embodiment of the invention is described below while referring to FIG. 8.

Figure 8:
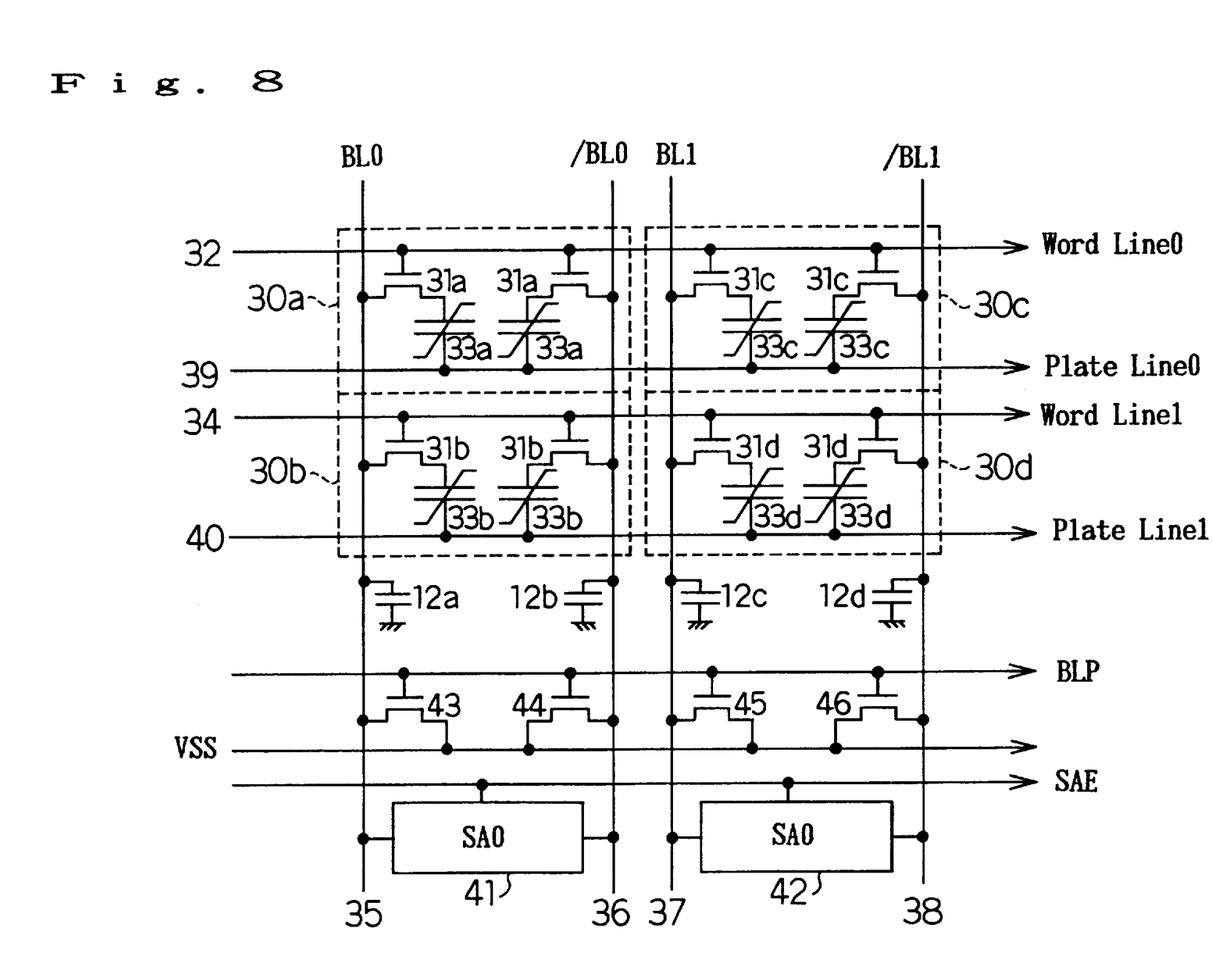
FIG. 8 is a circuit block diagram of a semiconductor memory device in a seventh embodiment of the invention.

In FIG. 8, reference numerals 12a to 12d are capacity elements existing between memory cells 30a to 30d and bit line precharging transistors 43 to 46.

Considering the case of reading out the memory cell 30a, in the actual semiconductor memory, a parasitic resistance 3 (Rcp) is present, and in the case of rewriting operation (that is, in the process of setting the bit line precharge control signal BLP to logic voltage "H" and the bit lines 35, 36 to logic voltage "L"), the cell plate line 39 temporarily becomes negative in voltage due to capacity coupling of the ferroelectric capacitor capacity (Cmc) for setting one of the complementary data to logic voltage "H."

The time constant is about n×Rcp×Cmc. Herein, n is the number of bit line pairs activated simultaneously.

It is a feature of the ferroelectric memory cell that the capacity per unit area is large, but in the case of rewriting operation, the coupling capacity of the bit line and cell plate line becomes large.

Supposing the memory cell capacity to be constant, the greater the number of bit line pairs (n) activated simultaneously and the greater the parasitic resistance, the larger negative voltage has the cell plate line.

For example, if eight bit line pairs are activated, the parasitic resistance (Rcp) of plate line is 500 ohms, and the capacitor capacity (Cmc) of memory cell is 2 pF, the period of the cell plate line 39 temporarily becoming a negative voltage is 8×500 ohms×2 pF=8 nsec. When the period required for precharging the bit line is shorter than this period, that is, the period of changeover of the bit line from logic voltage "H" state to logic voltage "L" state (the transition time) is shorter than 8 nsec, the cell plate line 39 is temporarily negative in voltage. As a result of simulation, it is found, when the supply voltage is 5 V, the voltage of the cell plate line 39 is lowered to about −1.5 V.

Herein, setting the transition time (time constant) of the bit line voltage from logic voltage "H" to "L" at 8 nsec or more, the cell plate line does not become negative in voltage, and the operation point of the ferroelectric capacitor for writing "0" of the memory cell remains at point E in FIG. 10.

That is, when the capacity of the bit line is 1 pF, and the resistance for turning on the transistor for precharging the bit line is 5 kohms, by setting the capacity of the added capacity elements 12a to 12d at 1 pF or more, the period (transition time) of changeover of the bit line from logic voltage "H" to logic voltage "L" is 5 kohms×(1+1) pF=10 nsec. In this condition, the transition time is longer than the time constant of about 8 nsec of the cell plate line 39 temporarily becoming negative in voltage, due to capacity coupling of the ferroelectric capacitor capacity (Cmc) for setting one of the complementary data to logic voltage "H." Therefore, the voltage of the cell plate line 39 generated for precharging the bit line does not become lower than 0 V.

That is, in rewriting operation, the cell plate line 39 is prevented from becoming lower than 0 V voltage, and the logic voltage "L" data of the memory cell of the complementary data is not lost, so that the semiconductor memory device of stable nonvolatile ferroelectric may be realized.

The added capacity elements 12a to 12d may be formed of gate capacity of MOS transistor. Or, by using the ferroelectric capacitor, since the specific inductive capacity is high, the area can be reduced to $\frac{1}{10}$ to $\frac{1}{100}$.

Thus, according to the first embodiment of the invention, comprising the diodes of which N-type semiconductors are connected to the cell plate lines 39, 40, and P-type semiconductors, to the grounding level, the voltage of the cell plate line is lowered only to the built-in voltage (about −0.7 V) of the diodes.

That is, in rewriting operation, the cell plate line 39 is prevented from becoming lower than −1 V voltage, that is, more than the coercive voltage (about −0.7 V) of the ferroelectric capacitor, and the logic voltage "L" data of the memory cell of the complementary data is not lost, so that the semiconductor memory device of stable nonvolatile ferroelectric maybe realized. Moreover, the diodes connected to the cell plate lines can be formed simultaneously when forming the source and drain of the N-type transistor of the semiconductor device, and can be reduced in area, so that it does not add to the manufacturing cost of the semiconductor memory device.

According to the second embodiment of the invention, the N-type transistor is connected to the grounding level at its gate and source, and to the cell plate line at its drain. As compared with the first embodiment, although the area is increased inside the semiconductor memory device, since the threshold voltage of the transistor is controlled, a nonvolatile semiconductor memory device of stabler operation is realized. By contrast, in the first embodiment, as mentioned above, since the built-in potential of the diode is not monitored in the inspection process, it may fluctuate.

According to the third embodiment of the invention, one electrode of each one of the ferroelectric capacitors 9, 10 is connected to the grounding level, and the other electrode, to the cell plate line. By increasing the capacity of these added ferroelectric capacitors, in rewriting operation, the voltage of the cell plate line can be controlled, and the logic voltage "L" data of the memory cell of the complementary data is not lost, so that the semiconductor memory device of stable nonvolatile ferroelectric may be realized.

According to the fourth embodiment of the invention, the cell plate line of adjacent memory cells is shared. As a result, the parasitic capacity connected to the cell plate line is increased, and therefore in the process of setting the bit line precharge control signal BLP to logic voltage "H" and the bit line to logic voltage "L," the voltage of the cell plate line is determined by the capacity division with the capacity of logic voltage "H" of the memory cell. Accordingly, the transition amount to negative voltage of the cell plate line is reduced to half.

According to the fifth embodiment of the invention, it comprises a transistor of which drain is connected to the junction point of the memory cell transistor and ferroelectric capacitor, gate is connected to the line of bit line precharge control signal, and source is connected to the cell plate line. Because of this transistor, in the process of setting the bit line precharge control signal BLP to logic voltage "H" and the bit line to logic voltage "L," the cell plate line never becomes negative in voltage, and the voltage applied to both ends of the ferroelectric capacitor of the memory cell is not inverted.

That is, in rewriting operation, the cell plate line 39 is prevented from becoming lower than 0 V voltage, and the logic voltage "L" data of the memory cell of the complementary data is not lost, so that the semiconductor memory device of stable nonvolatile ferroelectric may be realized.

According to the sixth embodiment of the invention, resistance elements are added between the bit line of the memory cell and the bit line precharging transistor. The resistance value of the resistance elements is set so that the time constant due to the capacity of the resistance elements and the bit lines may be greater than the time constant due to the parasitic resistance present between the cell plate driver and plate line and the ferroelectric capacitor of the memory cell. Hence the cell plate line is prevented from becoming lower than 0 V voltage due to capacity coupling of the memory cell capacity and cell plate line, and the logic voltage "L" data of the memory cell of the complementary data is not lost, so that the semiconductor memory device of stable nonvolatile ferroelectric may be realized.

According to the seventh embodiment of the invention, capacity elements are added between the bit line of the memory cell and the bit line precharging transistor. The value of the capacity elements is set so that the time constant due to the capacity of the capacity elements and the bit lines and the transistor ON resistance for setting the bit line to the grounding voltage may be greater than the time constant due to the parasitic resistance present between the cell plate driver and plate line and the ferroelectric capacitor of the memory cell. Hence the cell plate line is prevented from becoming lower than 0 V voltage due to capacity coupling of the memory cell capacity and cell plate line, and the logic voltage "L" data of the memory cell of the complementary data is not lost, so that the semiconductor memory device of stable nonvolatile ferroelectric may be realized.

As described herein, according to the embodiments, in rewriting operation, the cell plate line is prevented from becoming an excessive negative voltage (about −1 V) temporarily, and the content of the memory cell storing the logic voltage "L" data of complementary data is not lost, so that the semiconductor memory device of stable nonvolatile ferroelectric may be realized.

As clear from the description herein, the invention realizes a stabler operation than before in rewriting operation.

Industrial Applicabilitys

As described above, the semiconductor memory device of the invention comprises, for example, voltage stabilizing means such as diodes 1, 2 connected to cell plate lines 39, 40 as shown in FIG. 1. Therefore, in rewriting operation for setting the bit line precharge control signal BLP to logic voltage "H" and the bit lines 35, 36 to logic voltage "L," if a parasitic resistance 3 is present in the cell plate line 39, since the diodes 1, 2 are connected, the cell plate line 39 is prevented from becoming an excessive negative voltage (for example, less than −1 V) temporarily. As a result, in rewriting operation, the logic voltage "L" data of the memory cell of the complementary data is not lost, so that the semiconductor memory device of stable nonvolatile ferroelectric may be realized.

We claim:

1. A semiconductor memory device comprising:

a plurality of memory cells, each having at least one ferroelectric capacitor, for storing information by using a polarized state of the at least one ferroelectric capacitor within each memory cell, word lines connected to each of the plurality of memory cells, for selection of at least one of the plurality of memory cells, data lines connected to each of the plurality of memory cells, for reading the information from the at least one selected memory cell, cell plate lines connected to each of the plurality of memory cells, for reading and rewriting of the information, and voltage stabilizing means connected directly to each of the cell plate lines for stabilizing a voltage applied to each of the cell plate lines when rewriting the at least one ferroelectric capacitor within each memory cell.

2. A semiconductor memory device of claim 1, wherein the voltage stabilizing means for each of the cell plate lines comprises a diode having a negative electrode connected to the respective cell plate line, and a positive electrode connected to a ground potential.

3. A semiconductor memory device of claim 1, wherein the voltage stabilizing means for each of the cell plate lines comprises an N-type transistor having a drain connected to the respective cell plate line, and gate and source connected to a ground potential.

4. A semiconductor memory device of claim 1, wherein the voltage stabilizing means for each of the cell plate lines comprises a second ferroelectric capacitor in which one electrode of the second ferroelectric capacitor is connected to the respective cell plate line, and another electrode of the second ferroelectric capacitor is connected to a ground potential.

5. A semiconductor memory device of claim 1, wherein the word lines and data lines are arranged in a matrix, and one of the cell plate lines is disposed between two of the word lines, and between at least two memory cells of the plurality of memory cells, said one of the cell plate lines shared by the two memory cells and the voltage stabilizing means is the one cell plate line.

6. A semiconductor memory device of claim 1, wherein each one of the plurality of memory cells includes switching means for changing an electric connection state between the at least one ferroelectric capacitor and one of the data lines of the each one of the plurality of memory cells, and the voltage stabilizing means is a transistor element, and a drain of the transistor element is connected to the switching means, a source of the transistor element is connected to one of the cell plate lines, and a gate of the transistor element is connected to a signal line for precharging the data lines.

7. A semiconductor memory device of claim 1, further comprising a transistor used as a switching element for setting one of the data lines at ground potential when rewriting the at least one ferroelectric capacitor within each memory cell, wherein the voltage stabilizing means is a resistance element connected to each one of the data lines, and a time constant of the resistance element and a capacitance of the respective data line is greater than a time constant of a parasitic resistance of one of the cell plate lines and the at least one ferroelectric capacitor within each memory cell.

8. A semiconductor memory device of claim 1, further comprising a transistor used as a switching element for setting one of the data lines at ground potential when rewriting the at least one ferroelectric capacitor within each memory cell, wherein the voltage stabilizing means is a capacitive element having two electrodes, one electrode connected to said one of the data lines, and the other electrode connected to a ground potential, and a time constant of the capacitive element and said one of the data lines and an ON resistance of the transistor is greater than a time constant of a parasitic resistance of one of the cell plate lines and the at least one ferroelectric capacitor within each memory cell.

* * * * *